United States Patent [19]

Linton et al.

[11] Patent Number: 4,749,821

[45] Date of Patent: Jun. 7, 1988

[54] EMI/RFI SHIELD CAP ASSEMBLY

[75] Inventors: John C. Linton, Potomac; William Gingras, Friendship, both of Md.

[73] Assignee: FIC Corporation, Rockville, Md.

[21] Appl. No.: 883,932

[22] Filed: Jul. 10, 1986

[51] Int. Cl.[4] .................... H05K 9/00

[52] U.S. Cl. .................... 174/35 R; 337/199; 337/206

[58] Field of Search .................... 174/35 R, 35 GC, 52 H; 337/199, 203, 206; 220/375; 200/304, 305

[56] References Cited

U.S. PATENT DOCUMENTS

| | | | |
|---|---|---|---|
| 2,599,472 | 6/1952 | Miller | 220/375 X |
| 2,958,750 | 11/1960 | Lebens | 200/305 X |
| 2,989,610 | 6/1961 | Linton | 337/206 |
| 3,227,974 | 1/1966 | Gray | 174/35 R |
| 3,292,050 | 12/1966 | Grossoehme | 174/52 H X |
| 3,491,271 | 1/1970 | Weaver et al. | 174/52 H X |
| 3,924,216 | 12/1975 | Martin et al. | 337/206 |

*Primary Examiner*—Fred L. Braun
*Assistant Examiner*—David A. Tone
*Attorney, Agent, or Firm*—Brady, O'Boyle & Gates

[57] ABSTRACT

An EMI/RFI shield cap assembly retrofitted to standard military and/or commercial, panel mounted, indicating and non-indicating fuse holders.

13 Claims, 2 Drawing Sheets

FIG. 1
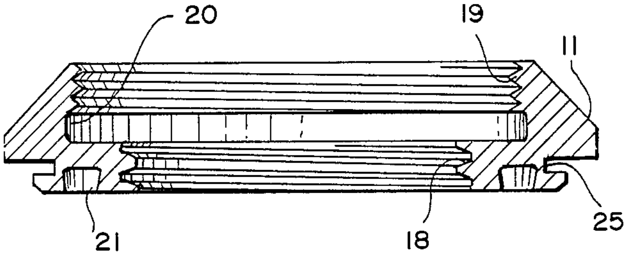
FIG. 2
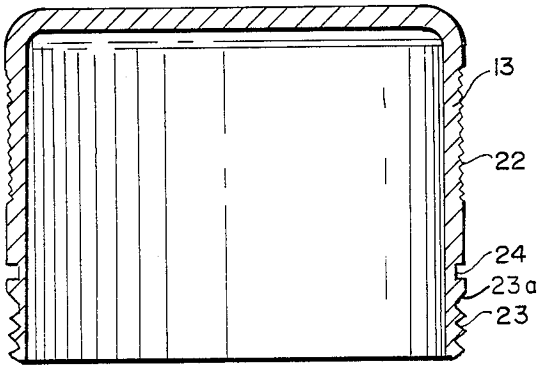
FIG. 3
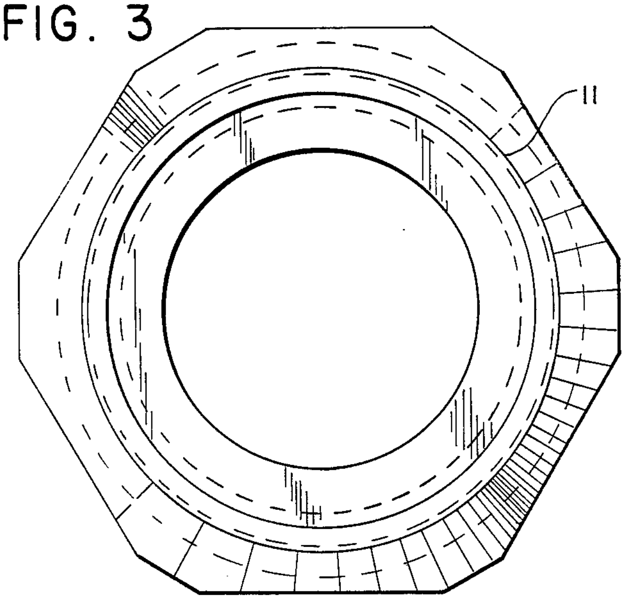
FIG. 4
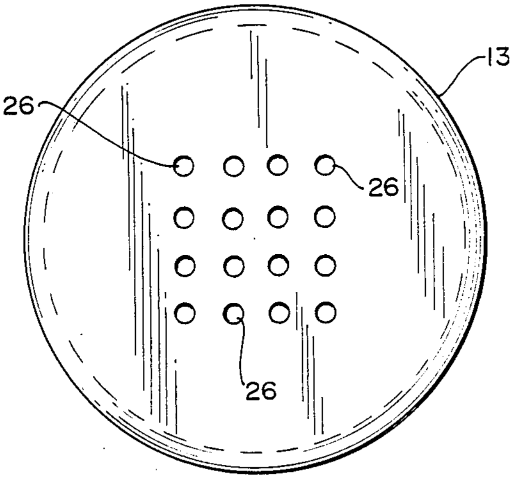
FIG. 5
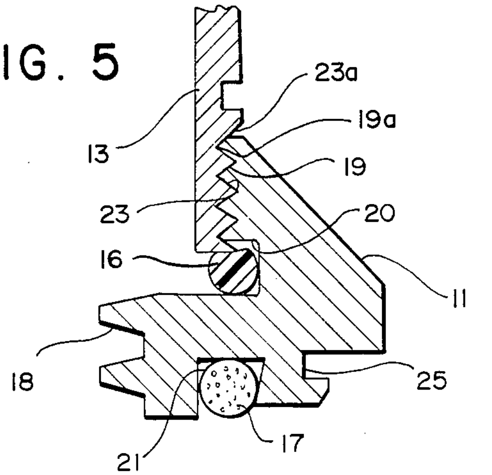
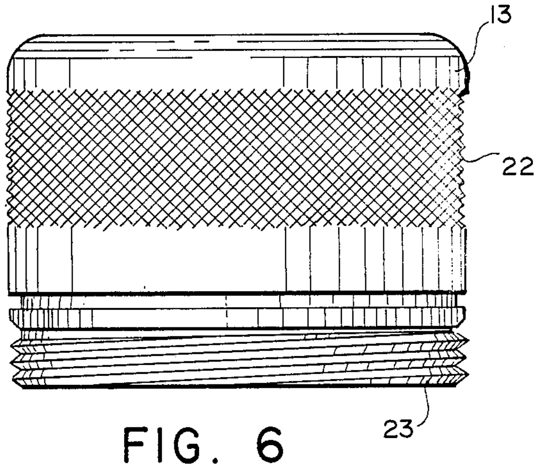
FIG. 6

EMI/RFI SHIELD CAP ASSEMBLY

BACKGROUND OF THE INVENTION

A standard military and/or commercial, panel mounted, indicating fuse holder is disclosed in U.S. Pat. No. 2,989,610 to W. C. Linton dated June 20, 1961, wherein a standard cartridge type fuse is housed and provided with a lamp so that when the fuse blows, the lamp will glow to indicate the inoperative condition of the fuse. In non-indicating fuse holders, the lamp is omitted.

In order to meet the stringent EMI/RFI emission control standards of the various electrical equipment in which the standard fuse holders are employed, it has become necessary to provide the fuse holders with an EMI/RFI shield. While the concept of providing an indicating fuse holder with an EMI shield has been suggested in U.S. Pat. No. 3,924,216 to Martin dated Dec. 2, 1975, the shield cap assembly of the present invention is an improvement thereon, and comprises, essentially, a metal cap threadably connected to a nut which also secures the fuse holder housing to the panel in which it is mounted. A rubber O-ring is mounted within the nut and is engaged by the inner end of the cap when threaded onto the nut, and an electrically conductive O-ring is mounted in the nut and is engaged by the face of the panel on which the fuse holder housing is mounted. The closed end of the cap is provided with a plurality of small apertures for viewing the light on an indicating-type fuse holder, and a plastic tether is provided to prevent loss of the cap when the cap is removed from the operative position for changing a fuse.

By the construction and arrangement of the shield cap assembly of the present invention, the cap can be added, or field retrofitted, to standard military and/or commercial fuse holders installed in equipment, while in use, without removal, major disassembly, or wiring change. The cap, associated nut and electrically conductive O-ring provide a metallic capsule completely enclosing the fuse holder and panel aperture in which the assembly is mounted. The aperture pattern and size in the closed end of the cap are configured and arranged to provide optimum light transmission during blown fuse indication with minimum EMI radiation.

Other advantages provided by the shield cap assembly of the present invention will become apparent to those skilled in the art during the course of the following detailed description.

BRIEF DESCRIPTION OF THE DRAWINGS

FIG. 1 is a sectional side elevational view of the nut employed for connecting the fuse holder to the mounting panel and the shield cap to the fuse holder;

FIG. 2 is a sectional side elevational view of the shield cap of the present invention for use on a non-indicating fuse holder;

FIG. 3 is a top plan view of the nut shown in FIG. 1;

FIG. 4 is a top plan view of a shield cap for use on an indicating fuse holder;

FIG. 5 is a fragmentary, sectional view showing the interconnection of the nut, shield cap, electrically conductive O-ring and rubber O-ring;

FIG. 6 is a side elevational view of the shield cap;

DESCRIPTION OF THE PREFERRED EMBODIMENT

Figure 7:
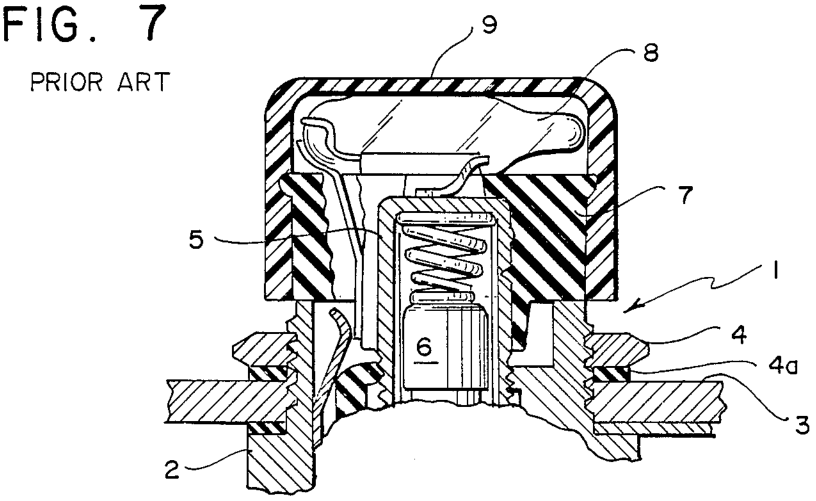
FIG. 7 PRIOR ART
FIG. 7 is a fragmentary, sectional view showing a standard or conventional indicating fuse holder secured to a mounting panel.

Referring to the drawings and more particularly to FIG. 7, a standard military and/or commercial indicating fuse holder 1 of the type disclosed in the aforementioned Linton U.S. Pat. No. 2,989,610, and manufactured by the assignee of the present invention, is shown. The fuse holder 1 comprises, essentially, a base 2 extending through a mounting panel 3 and secured therein by a nut 4. The base 2 contains the conventional fuse socket 5 and spring-biased cartridge type fuse 6, the fuse socket being molded into an insulating plug 7 which supports an indicator lamp 8 enclosed by a transparent cap 9, whereby when the fuse 6 blows, the lamp 8 will glow to indicate the inoperative condition of the fuse.

Figure 8:
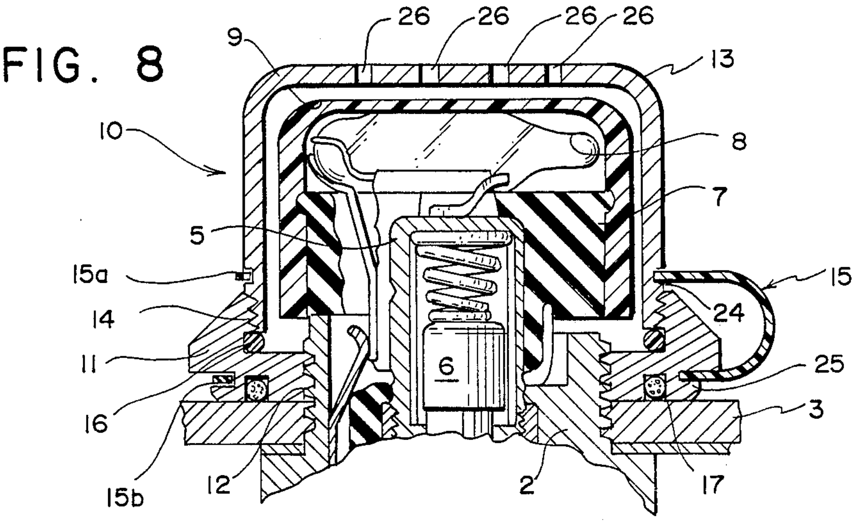
FIG. 8 is a fragmentary, sectional view, showing the shield cap assembly retrofitted to an indicating fuse holder of the type shown in FIG. 7.

FIG. 8 illustrates the EMI/RFT shield cap assembly 10 of the present invention connected to the standard indicating fuse holder 1, as described in connection with FIG. 7. The fuse cap assembly 10 of the present invention comprises a metal nut 11 threadably connected as at 12 to the fuse holder base 2. A shield cap 13 is threadably connected as at 14 to the nut and a non-metallic tether 15 is provided to prevent loss of the cap 13 when it is removed from the nut 11 for changing the fuse 6. An elastomeric O-ring 16 is mounted within the nut 11 and is engaged by the inner end of the cap 13, and an electrically conductive O-ring 17 is also mounted within the nut 11 and engages the face of the panel 3 on which the fuse holder 1 is mounted.

The details of the construction of the nut 11 are illustrated in FIGS. 1 and 3, wherein it will be seen that the nut is hexagonal, and has axially spaced threaded end portions 18 and 19, the end of the nut having threads 18 being of a smaller diameter than the diameter of the nut having the threads 19. The space between the threaded end portions 18 and 19 forms an annular groove 20 for receiving the elastomeric O-ring 16 as shown in FIG. 5. The end face portion of the nut 11 adjacent the threads 18 is also provided with an annular groove 21 for receiving the electrically conductive O-ring 17.

The details of the construction of the shield cap 13 of the present invention are illustrated in FIGS. 2, 4 and 6 wherein it will be seen that the cap is constructed of metal and provided with a knurled side wall 22. The open end portion of the cap is provided with external threads 23 adapted to cooperate with the internal threads 19 on the nut 11, as shown in FIG. 5. The thread portion 23 on the end portion of the cap 13 is chamfered as at 23*a* and cooperates with a similarly configured chamfer 19*a* on the internal thread portion 19 on the nut to provide an EMI/RFI seal. The side wall of the cap is also provided with an annular groove 24 for receiving a ring portion 15*a* on one end of the non-metallic tether 15, as shown in FIG. 8 and the nut 11 is also provided with a similarly configured groove 25 for receiving a ring portion 15*b* on the opposite end of the tether. The tether ring portions 15*a* and 15*b* are freely received within the respective grooves 24 and 25 to facilitate unscrewing the cap.

When used with an indicating fuse holder, the end wall of the cap is provided with a plurality of apertures 26, as shown in FIGS. 4 and 8, configured and arranged to provide optimum light transmission during blown fuse indication with minimum EMI radiation. Caps to be used on a non-indicating fuse holder 27, as shown in FIG. 9, are not provided with the apertures.

To install the EMI/RFI shield cap assembly 10 of the present invention on a standard military and/or commercial panel mounted indicating fuse holder 1, as shown in FIG. 7, it is only necessary to remove the transparent cap 9, the conventional nut 4 and locking washer 4*a*; provide a conductive surface around the mounting hole in panel 3, and then substitute the nut 11 of the present invention for the conventional nut 4 and locking washer 4*a*, to thereby secure the fuse holder to the mounting panel 3. The transparent cap 9 is replaced and the shield cap 13 is threaded onto the nut 11.

Figure 9:
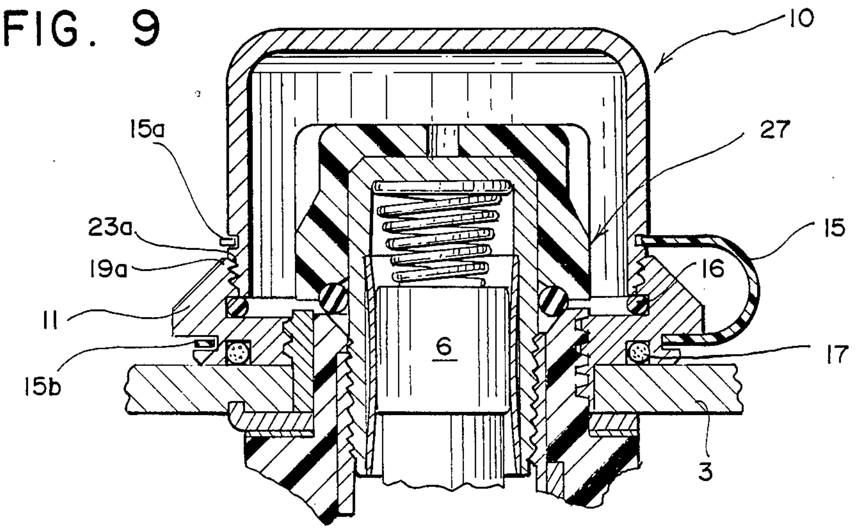
FIG. 9 is a view similar to FIG. 8 showing the shield cap assembly of the present invention retrofitted to a non-indicating fuse holder.

The same procedure is performed on the non-indicating fuse holder 27, as shown in FIG. 9; the nut 4 and locking washer 4*a* are replaced by the nut 11 of the present invention to thereby secure the fuse holder to the mounting panel 3.

From the above description, it will be appreciated by those skilled in the art that the shield cap assembly of the present invention can be added or field retrofitted to standard military and/or commercial fuse holders installed in equipment, while in use, without removal, major disassembly, or wiring change. The cap 13, nut 11 including chamfered portions 19*a*, 23, and electrically conductive O-ring 17, together with the conductive surface on panel 3, completely enclose the fuse holder, to thereby provide an effective EMI/RFI shield.

It is to be understood that the form of the invention herewith shown and described is to be taken as a preferred example of the same, and that various changes in the shape, size and arrangement of parts may be resorted to, without departing from the spirit of the invention or scope of the subjoined claims.

We claim:

1. A panel mounted fuse holder housing a cartridge type electrical fuse, said fuse holder including a threaded base portion, a mounting nut securing the fuse holder to said mounting panel and including first and second axially spaced threaded end portions, and a generally flat end face abutting the mounting panel, said second threaded end portion further engaging the threaded base portion of the fuse holder to secure the fuse holder to the mounting panel, and an EMI/RFI shield cap including a threaded annular end portion engaging the first threaded end portion of the mounting nut, whereby an EMI/RFI shielded fuse holder is provided.

2. A panel mouted fuse holder according to claim 1 wherein said mounting nut includes a first annular groove located between said first and second threaded end portions and a second annular groove in said end face, and first and second O-rings respectively mounted in said first and second annular grooves.

3. A panel mounted fuse holder according to claim 2 wherein said mounting nut comprises a metal nut and said shield cap comprises a metal cap.

4. A panel mounted fuse holder according to claim 3 wherein said fuse holder further includes a non-metallic inner cap on said base portion of the fuse holder and wherein said metal shield cap fits over the non-metallic inner cap.

5. A panel mounted fuse holder according to claim 2 wherein at least one of said O-rings comprises an electrically conductive O-ring.

6. A panel mounted fuse holder according to claim 2 wherein said first O-ring comprises an elastomeric O-ring and wherein said second O-ring comprises an electrically conductive O-ring.

7. A panel mounted fuse holder according to claim 2 wherein said first and second threaded end portions comprise inwardly facing thread portions and said threaded base portion of said fuse holder and said threaded annular end portion of said shield cap comprise outwardly facing thread portions.

8. A panel mounted fuse holder according to claim 1 wherein said fuse holder includes an indicator lamp which becomes illuminated during a blown fuse condition and wherein said cap is provided with a plurality of apertures to provide light transmission therethrough from said indicator lamp.

9. A panel mounted fuse holder according to claim 8 wherein said fuse holder further includes a transparent inner cap enclosing said indicator lamp and wherein said shield cap fits over the transparent inner cap.

10. A panel mounted fuse holder according to claim 9 wherein said shield cap comprises a metal cap.

11. A panel mounted fuse holder according to claim 1, wherein a tether is connected between the cap and the nut.

12. A panel mounted fuse holder according to claim 11, wherein the cap and nut include respective annular grooves within their outer side walls and wherein the tether is non-metallic and includes ring portions on each end thereof loosely engaged respectively within said annular grooves.

13. A panel mounted fuse holder according to claim 1, wherein a chamfer is provided on the threaded end portion of the cap cooperating with a similarly configured chamfer on the threaded end portion of the nut, to thereby form an EMI/RFI seal.

* * * * *